(12) United States Patent
Abraham et al.

(10) Patent No.: US 7,453,747 B2
(45) Date of Patent: *Nov. 18, 2008

(54) ACTIVE COMPENSATION FOR OPERATING POINT DRIFT IN MRAM WRITE OPERATION

(75) Inventors: David William Abraham, Croton, NY (US); Philip Louis Trouilloud, Norwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/865,517

(22) Filed: Oct. 1, 2007

(65) Prior Publication Data

US 2008/0019169 A1   Jan. 24, 2008

Related U.S. Application Data

(63) Continuation of application No. 10/695,010, filed on Oct. 28, 2003, now Pat. No. 7,286,421.

(51) Int. Cl.
  *G11C 7/00* (2006.01)
  *G11C 11/00* (2006.01)
(52) U.S. Cl. .................. 365/201; 365/158; 365/189.09
(58) Field of Classification Search ............ 365/171, 365/158, 201
  See application file for complete search history.

(56) References Cited

U.S. PATENT DOCUMENTS

| | | | |
|---|---|---|---|
| 6,385,082 B1 * | 5/2002 | Abraham et al. | 365/171 |
| 6,490,203 B1 * | 12/2002 | Tang | 365/185.22 |
| 6,545,906 B1 * | 4/2003 | Savtchenko et al. | 365/158 |
| 6,606,262 B2 * | 8/2003 | Perner | 365/158 |
| 6,751,147 B1 * | 6/2004 | Smith et al. | 365/225.5 |
| 6,791,873 B1 * | 9/2004 | Perner | 365/158 |

\* cited by examiner

*Primary Examiner*—Hoai V. Ho
*Assistant Examiner*—Michael J Weinberg
(74) *Attorney, Agent, or Firm*—Michael J. Buchenhorner; Ido W. Tuchman

(57) ABSTRACT

A method and apparatus for minimizing errors that may occur when writing information to a magnetic memory cell array with an operating write current due to changes in the local magnetic fields and. A test write current is sent to a reference memory cell and the effect of the test current on the orientation of the magnetization in the reference cell is monitored. The write current is then modified to compensate for any changes in the optimum operating point that have occurred. Arrays of reference magnetic memory cells having varying properties may be used to more accurately characterize any changes that have occurred in the operating environment. A phase difference between a time varying current used to drive the reference cell and the corresponding variations in the orientation of the magnetization in the reference cell may also be used to further characterize changes in the operating environment.

6 Claims, 3 Drawing Sheets

US 7,453,747 B2

ACTIVE COMPENSATION FOR OPERATING POINT DRIFT IN MRAM WRITE OPERATION

CROSS-REFERENCE TO RELATED APPLICATIONS

This application is a continuation of commonly-owned, U.S. application Ser. No. 10/695,010, filed on Oct. 28, 2003 now U.S. Pat. No. 7,286,421.

STATEMENT REGARDING FEDERALLY SPONSORED-RESEARCH OR DEVELOPMENT

This invention was made as a result of research sponsored by DARPA contract number MDA972-99-C0009. The United States Government may have certain rights to this invention.

INCORPORATION BY REFERENCE OF MATERIAL SUBMITTED ON A COMPACT DISC

None.

FIELD OF THE INVENTION

The invention disclosed broadly relates to the field of computer memory. More particularly, the present invention relates to a method and apparatus for actively compensating for operating point drift in the magnetic memory cells of a magnetic memory array.

BACKGROUND OF THE INVENTION

Magnetic memory cells are memory cells that store information in the orientation of the magnetization of a ferromagnetic region. These magnetic memory cells are nonvolatile and can hold stored information for long periods of time. Magnetic memory cells that use a magnetic state to alter the electrical resistance of the materials near the ferromagnetic region are collectively known as magnetoresistive (MR) memory cells. An array of magnetic memory cells is often called magnetic RAM or MRAM (magnetic random access memory). MRAM arrays include an array of magnetic memory cells positioned at the intersections of wordlines and bitlines. Each cell includes a magnetically changeable or free region and a proximate reference region arranged into a magnetic tunnel junction ("MTJ") device. The principle underlying storage of data in such cells is the ability to change the relative orientation of the magnetization of the free and reference regions by changing the direction of magnetization along the easy axis ("EA") of the free region, and the ability to thereafter read this relative orientation difference. More particularly, MRAM cells are written to by reversing the free region magnetization using applied electrical, and resultant magnetic stimuli via their respective bitline and wordline, and are later read by measuring the resultant tunneling resistance between their bitlines and wordlines. The tunneling resistance assumes one of two values depending on the relative orientation of the magnetization of the free region with respect to the reference region. If the free region is modeled as a simple elemental magnet having a direction of magnetization which is free to rotate but with a strong preference for aligning in either direction along its easy axis (+EA or −EA), and if the reference region is, for example, a similar elemental magnet but having a direction of magnetization fixed in the +EA direction, then two states (and therefore the two possible tunneling resistance values) are defined for the cell: aligned (+EA/+EA) and anti-aligned (−EA/+EA). These two states may be used to represent a logical "1" or "0" for typical binary processing applications.

Coercivity refers to the magnetic field strength required to alter the orientation of the magnetization in a magnetic memory cell. A write current is typically used to provide the required magnetic field needed to alter the orientation of the magnetization of the magnetic memory cell. In a MRAM device, the bits should all have approximately the same coercivity so that they can all be altered using a write current and corresponding magnetic field of approximately the same strength. However, changes in the environment of an MRAM chip, or in the chip itself, may cause variations in the switching parameters of magnetic memory cells. One way to compensate for these changes in environmental conditions is to alter the magnetization of the magnetic memory cell with a write current that is larger than the minimum current needed to alter the orientation of the magnetization. Nevertheless, if the changes in the operating environment are serious enough, the write margin of the write current may be reduced to the point that unacceptable write errors occur.

A variety of other measures have been used to minimize the likelihood of write errors due to changes in environmental conditions. For example, magnetic shielding may be employed to reduce the effects of changes in the surrounding magnetic field on the magnetic memory cells. In a similar fashion, error causing temperature changes can be minimized by housing the magnetic memory cells in a temperature controlled environment. Although these measures are helpful, they suffer from a number of drawbacks. For instance, magnetically shielding the memory cells may fail to achieve the desired results if the shield material becomes saturated or the external fields are lower in amplitude than the coercive field of the shield. In addition, providing a temperature controlled environment may be unduly expensive or impractical in certain situations.

Therefore, there is a need for an improved method and apparatus for compensating for changes in environmental factors that may cause write errors when writing information to a magnetic memory array.

SUMMARY OF THE INVENTION

A preferred embodiment of the present invention is directed toward a method for minimizing errors that may occur when writing information to a magnetic memory cell array with an operating write current. In accordance with the method, a reference cell having known operating characteristics and a magnetization with an alterable orientation is provided. An attempt is made to alter orientation of the magnetization of the reference cell with a test write current having pre-selected attributes. The operating write current is then modified based upon whether or not the orientation of the magnetization in the reference cell was altered. In an alternative embodiment, the reference cell may be an array of reference cells having different attributes, such as different junction sizes, and the operating write current modified based upon which reference cells in the array of reference cells had the orientation of their magnetization altered by the test write current. In other embodiments, the reference cell may be an array of reference cells having similar attributes and each reference cell provided with a different test write current having pre-selected attributes. The operating write current is then modified based upon which test write currents altered the orientation of the magnetization of the reference cells. The signal modification circuit may be a wire for carrying the test write signal wherein the wire for each signal modification circuit has a different attribute that modifies the current or any other known method for producing different currents. The test write current may be sinusoidally varied and a phase difference measured between the test write current and the switching of the orientation of the magnetization in the reference cell. In such a case, the operating write current is modified based upon the measured phase difference. The test current may also be ramped between two values such as from 10 ma to 15 ma and the flipping of the orientation of the magnetization of the memory cell monitored to produce a square wave. This switching characteristic square wave is compared to an expected switching characteristic square wave to determine the appropriate modifications to make in the write currents due to the environmental conditions. The method may be performed continually at predetermined intervals or in response to a designated event. The reference cells referred to in the preceding discussion can be distinct from the cells comprising the memory device, or can in fact be part of the memory array itself (even to the extent of using the same cells both to test for changing environmental conditions and to eventually store information).

Another embodiment of the present invention is directed toward a compensation circuit for determining an appropriate write signal to use during a write operation to an array of magnetic memory cells wherein each magnetic memory cell in the array has a magnetization with an orientation that is alterable between at least two states. The compensation circuit includes a write signal generator for generating a write signal that is used to selectively alter the orientation of magnetization in the magnetic memory cells in the array of magnetic memory cells and a test write signal. A reference cell is provided that has a magnetization with an orientation that is alterable between at least two states for receiving the test write signal from the write signal generator. A reference cell reader determines the orientation of the magnetization in the reference cell after the reference cell has received the test signal. The write signal generator then selectively modifies the write signal based upon the orientation of the reference cell after the reference cell has received the test write signal. The reference cell may be an array of reference cells having different attributes. In such an embodiment, the write signal generator selectively modifies the write signal based upon which reference cells in the array of reference cells had the orientation of their magnetization altered in response to receiving the test write signal. Alternatively, the reference cell may be an array of reference cells having similar attributes. The test write signal received by each reference cell is then modified by a signal modification circuit associated with each reference cell and the write signal is modified based upon which reference cells had the orientation of their magnetization altered in response to being sent the test write signal. In addition, the test write signal may be varied with respect to time and the write signal modified based upon a measured phase difference between the test write signal and the corresponding variations in the orientation of the magnetization of the reference cell.

Yet another embodiment of the present invention is directed toward a method for compensating for changes in an optimum operating point for a write signal used to alter the orientation of the magnetization in a magnetic memory cell in an array of magnetic memory cells. In accordance with the method, changes in the switching characteristics of a reference Stoner-Wohlfarth magnetic memory cell, rotational magnetic memory cell or other magnetic device are measured. Attributes of the write signal used to alter the orientation of the magnetization in the magnetic memory cells are then modified based upon the measured changes in the switching characteristics of the reference magnetic memory cell. The changes in switching characteristics of a reference magnetic memory cell may be determined by sending a test signal to a series of magnetic memory cells having predetermined attributes and determining which magnetic memory cells have the orientation of their magnetization altered by the test signal. Alternatively, the changes in the switching characteristics of the reference magnetic memory cell may be determined by sending a test signal to an array of similar reference magnetic memory cells such that each magnetic memory cell is driven by a different magnetic field and determining which magnetic memory cells have the orientation of their magnetization altered by the test signal.

Yet another method of measuring changes in the switching characteristics of the reference magnetic memory cell is to send a sinusoidally varying test signal to the reference magnetic memory cell and measure a phase difference between the test signal and changes in the orientation of the magnetization of the reference magnetic memory cell. The write signal is then modified based upon the determined phase difference.

This method is not dependent on a specific writing scheme or structure of the magnetic memory. For example, it can be applied to other methods such as rotational switching as described by Motorola (U.S. Pat. No. 6,545,906: "Method of writing to scalable magnetoresistance random access memory element"). In this case, the writing parameters such as the amplitude and sign of the toggle fields or temporal sequencing of the fields are adjusted in the memory array depending on which test junctions have the best writing conditions and operating window. The present method can equally well be applied to thermally-assisted writing of magnetic memory devices as discussed in U.S. Pat. No. 6,385,082 ("Thermally-assisted magnetic random access memory (MRAM)", Abraham and Trouilloud).

BRIEF DESCRIPTION OF THE DRAWINGS

To describe the foregoing and other exemplary purposes, aspects, and advantages, we use the following detailed description of an exemplary embodiment of the invention with reference to the drawings, in which.

Figure 1:
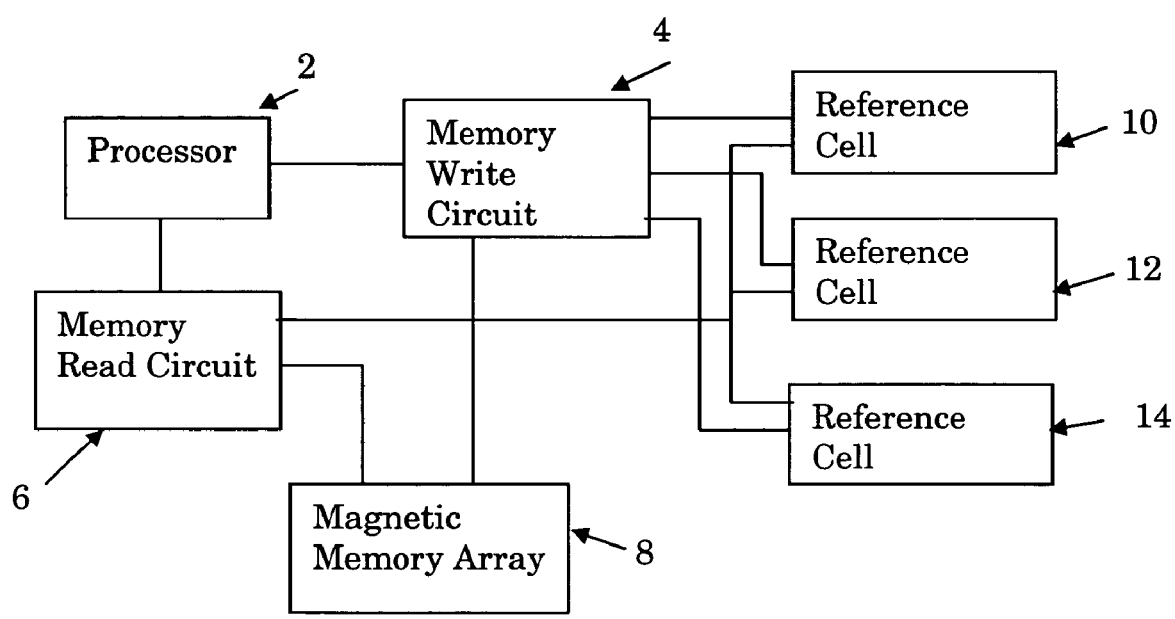
FIG. 1 is a block diagram of an information processing system constructed in accordance with a preferred embodiment of the present invention.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

Referring to FIG. 1, there is shown a block diagram of an information handling system in accordance with a preferred embodiment of the present invention. The information handling system is controlled by a processor 2. The processor 2 uses a memory write circuit 4 and a memory read circuit 6 to transfer digital information to and from a magnetic memory array 8. While the memory write circuit 4 and the memory read circuit 6 are shown as separate units from the processor 2 in FIG. 1, they may be a single element incorporated into an integrated circuit package. Furthermore, while a magnetic memory array is discussed for explanatory purposes, it will be appreciated by those skilled in the art that the present invention is applicable to all types of magnetic memory cells such as rotational magnetic memory cells or any other magnetic device whose functioning is influenced by the local magnetic environment. The memory read circuit 6 reads information from the magnetic memory array 8 by sending out a read signal to a magnetic memory cell in the magnetic memory array 8 and examining the response to determine whether a logical "1" or "0" is stored in the memory cell. Variations in the orientation of the magnetization of a memory cell in a magnetic memory array 8 are typically used to represent the stored digital information. These changes in the magnetization in turn cause changes in the magnetic memory cell's resistance, which are detected by the memory read circuit 6.

The memory write circuit 4 writes information to the magnetic memory array 8 by sending a write signal to a magnetic memory cell in the array 8 that creates a switching field that causes the orientation of the magnetization to substantially align in one of two possible directions. The write signal is usually a current or voltage of a specified value that has been determined to be the optimum value for switching the orientation of the magnetization in the magnetic memory cells under normal conditions. The write current can be modified to alter the magnitude or offset of the switching field created by the write current. A number of different write currents, such as a distinct word-line write current and bit-line write current, may actually be used to write information to the magnetic memory cells. However, it will be readily appreciated by those skilled in the art that the present invention can be easily be expanded to determine optimum write currents for each different type of write current used by the particular magnetic memory write circuitry 4 being employed.

As discussed in more detail above, changes in the local magnetic field and the temperature of the memory cells may result in changes in the optimum operating point. If these changes are large enough, the write operations will begin to deteriorate to the point that the bit-error rate rises above an acceptable level. Therefore, preferred embodiments of the present invention seek to identify changes in the optimum operating point for a write operation and modify attributes such as the amplitude of the write signal produced by the memory write circuit 4 to compensate for the identified changes.

Accordingly, at a predetermined point, or upon the occurrence of a specified event, when the information processing system of FIG. 1 is operating, the processor 2 enters a test routine. The test routine is initiated by the processor 2 instructing the memory write circuit 4 to send a test signal to a reference magnetic memory cell 10. The test signal is preferably, at least initially, the same signal used to write to the magnetic memory array 8. Once the test signal has been sent to the reference cell 10, the memory read circuit 6 determines whether or not the orientation of the reference cell 10 was altered by the test signal. If the reference cell had its magnetization altered by the test signal, the processor 2 preferably instructs the memory write circuit 4 to use its existing write signal to write information to the magnetic memory array 8. In such an embodiment, the reference cell 10 essentially represents a magnetic memory cell in the array 8. However, it will be appreciated that a variety of different reference cell arrangements could be used to evaluate the ambient conditions in accordance with the present invention. For example, in another preferred embodiment, a series of test signals are sent from the memory write circuit 4 to a reference cell 10 having a known set of properties. The series of test signals preferably vary in their amplitudes and offsets. The test signal may also be a ramped current signal that ramps the current between a low and high value. The memory read circuit 6 determines which test signals altered the magnetization in the reference cell 10 and which test signals did not alter the magnetization in the reference cell 10. The processor 2 then examines the test results and determines optimum write currents based upon the test results and a predetermined set of evaluation criteria. These evaluation criteria may vary in complexity from a simple scheme that merely looks for the lowest current that altered the magnetization to a more complex scheme that calculates the optimum operating currents based upon the values of the test currents and results of the tests. For example, the test results may be used to create a switching astroid that represents the switching fields needed to alter the magnetization of the memory cell along the hard and easy axis. The shape of the astroid may then be monitored and compared to a desired switching astroid to more completely characterize the drift in the switching parameters of the reference cells.

The present invention also encompasses an embodiment wherein an optimum operating current is determined by sending a similar test signal to multiple specially designed reference cells 10, 12 and 14 having different operating characteristics. In such an embodiment, each reference cell 10, 12 and 14 has a different geometry and/or magnetic coercivity. The individual properties of the reference cells 10, 12 and 14 are preferably selected such that they are each sensitive to changes in the surrounding magnetic field and temperature in a known and predictable manner. The test is initiated by sending a standardized test signal to each of the reference cells 10, 12 and 14. After the test signal is sent to the reference cells 10, 12 and 14 by the memory write circuit 4, the memory read circuit 6 reads the magnetization of the reference cells 10, 12 and 14 and communicates the results to the processor 2. The processor 2 then determines an optimum operating current based upon which reference cells 10, 12 and 14 had their magnetization altered by the test signal. The test signals are evaluated in accordance with a set of predetermined criteria that are dependent upon the particular properties of the individual specialized reference memory cells. For example, the alteration of the orientation of the magnetization in reference cell 12, but not in reference cell 14, may indicate the presence of an unusually large magnetic field and the need to increase the amplitude of the write current. Conversely, a test signal that alters the magnetization in all three reference cells 10, 12 and 14 may indicate a need to decrease the amplitude of the write current.

Figure 2:
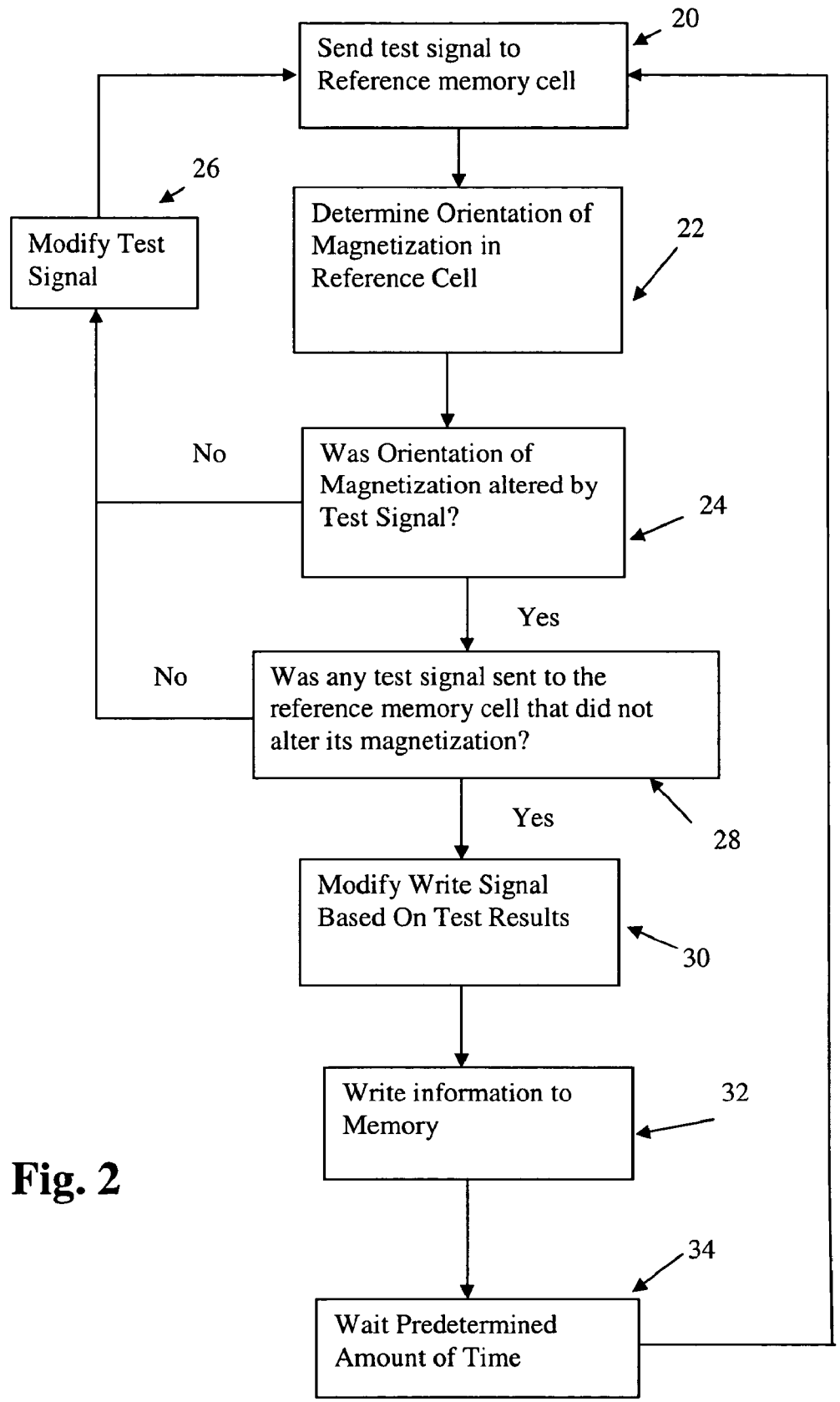
FIG. 2 is a flowchart of a method of compensating for operating point drift in accordance with a preferred embodiment of the present invention.

Referring now to FIG. 2, a flow chart for determining an optimum operating point for a write operation to a magnetic memory array in accordance with a preferred embodiment of the present invention is shown. The method commences in block 20 with the sending of a test signal to a reference memory cell. The orientation of the magnetization of the memory cell is then determined in block 22. In block 24, whether or not the magnetization of the reference cell was altered by the test signal is determined. If the magnetization was not altered, the method proceeds to block 26 wherein the test signal is modified. Preferably, the test signal is either incrementally increased or decreased in block 26 depending upon the prior test results. Once the test signal has been modified, the method returns to block 20 wherein the modified test signal is sent to the reference memory cell. If the orientation of the magnetization of the reference memory cell was altered by the test signal in block 24, the method proceeds to block 28 wherein it is determined whether or not a test signal was previously sent to the reference cell that did not alter the orientation of its magnetization. Step 28 allows the method to determine an operating point at which the reference memory cell begins to respond to the test signal by ensuring that at least one test signal failed to alter the orientation of the magnetization in the reference memory cell. For example, one embodiment of the method might gradually increase or ramp up the current of the test signal until the current was strong enough to alter the magnetization of the reference cell. If the initial test signal altered the magnetization of the reference memory cell, the current of the test signal could be incrementally decreased until a lower limit, whereby the test signal no longer altered the magnetization of the reference memory cell, is established. If a lower limit has been established, the method proceeds to block 30 wherein the write signal is modified based upon the test results. Preferably, the write current is modified such that it is the same as that of a test signal that properly altered the orientation of the magnetization of the reference magnetic memory cell. Once the write signal has been modified, the method proceeds to block 32 wherein information is written to the magnetic memory with the modified write signal. After the information has been written, a predetermined amount of time is allowed to pass before initiating the compensation routine again as set forth in block 34. In an alternative embodiment, the operating point compensation routine set forth in FIG. 2 could be performed prior to beginning any write operation to the magnetic memory.

Figure 3:
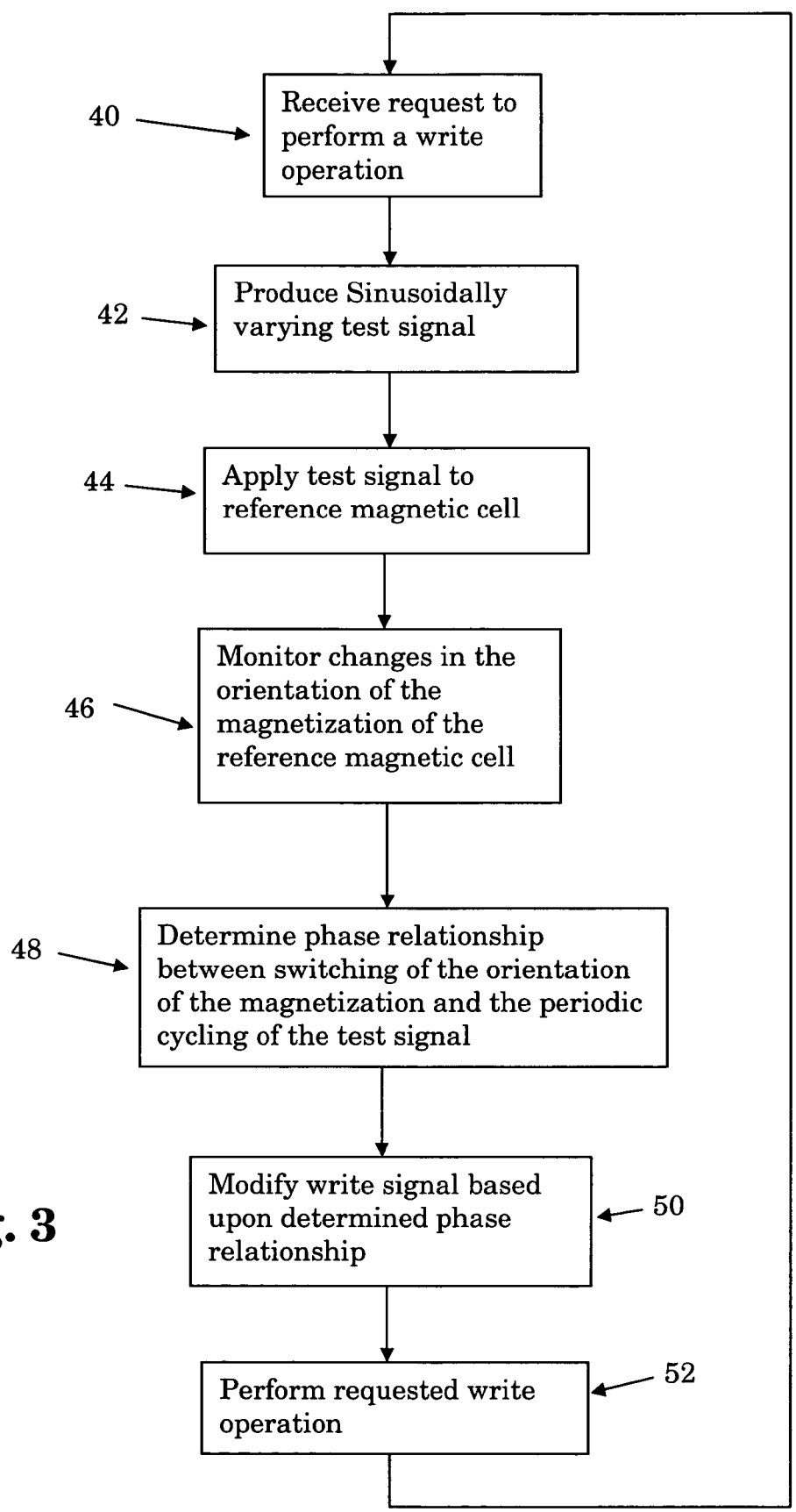
FIG. 3 is a flow chart illustrating another method of compensating for environmental changes in accordance with an embodiment of the present invention.

Referring now to FIG. 3, another preferred method for compensating for drift in the optimum operating point is shown. The method commences in block 40 with the receiving of a request to perform a write operation. Once the request has been received, the method proceeds to block 42 wherein a sinusoidally varying test signal is produced. Although a sinusoidal test signal is preferred, any type of periodic signal such as a ramped current signal could be used. In block 44, the test signal is applied to a reference magnetic cell. The changes in the orientation of the magnetization of the reference magnetic memory cell are monitored in block 46. Assuming the sinusoidal test signal is strong enough to alter the orientation of the magnetization at some point during its cycle, the periodic nature of the sinusoidal test signal will result in periodic changes in the orientation of the magnetization in the reference magnetic cell. These periodic changes in the orientation of the magnetization may be used to produce a periodic square wave that represents the changes in the magnetization. In block 48, a phase relationship between the switching of the orientation of the magnetization and the periodic cycling of the test signal is determined. Due to the sinusoidally varying nature of the test signal, the current strength that results in the switching of the magnetization in the reference cell can be determined from the phase relationship. Thus, in block 50, the write signal is modified based upon the determined phase relationship. Finally, in block 52, the requested write operation is performed with the modified write signal. The method then returns to block 40 and waits to receive the next request for a write operation.

The above described embodiments of the present invention provide a number of benefits over the prior art. First, by actively compensating for changes in the optimum write current, the present invention minimizes the need for relatively expensive passive measures such as magnetic shielding and temperature control. In addition, the present invention compensates for small perturbations in magnetic fields that might not be eliminated by magnetic shielding but are nevertheless large enough to cause problems in a magnetic memory array. Furthermore, the active nature of the invention allows it to compensate for changes in the local magnetic field and temperature as they occur. While the present invention has been described in conjunction with magnetic memory cells, it will be readily appreciated by those skilled in the art that it could be adapted for use with any type of magnetic device whose operation depends upon the magnetic conditions surrounding the device. Therefore, the present invention is a substantial improvement upon the prior art.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention. Therefore, while there has been described what is presently considered to be the preferred embodiment, it will be understood by those skilled in the art that other modifications can be made within the spirit of the invention. It should be understood that the invention is not limited to the embodiments described above, but rather should be interpreted within the full meaning and scope of the appended claims.

We claim:

1. A method for minimizing errors when writing information to memory cells in a magnetic memory cell array with operating write currents, wherein the magnetic memory cell array comprises reference cells having known operating characteristics and a magnetization with an alterable orientation, and wherein each reference cell in the magnetic memory cell array has a different junction size, the method comprising:

applying test write currents having pre-selected attributes for altering orientation of the magnetization of the reference cells, wherein applying the test write currents comprises:

sinusoidally varying the test write currents:

measuring a phase difference between the test write currents and switching of the orientations of the magnetizations in each reference cell; and modifying operating write currents based upon the measured phase difference;

determining whether the orientations of the magnetizations in the reference cells were altered; and modifying the operating write currents.

2. The method of claim 1 wherein the magnetic memory cells are rotational magnetic memory cells.

3. The method of claim 1 wherein variations in the test write currents are generated by varying an attribute of wires carrying the test write currents to the reference cells.

4. A method for compensating for changes in an optimum operating point for write signals used to alter an orientation of a magnetization in a magnetic memory cell in an array of magnetic memory cells, said method comprising:

creating different magnetic fields for driving each reference magnetic memory cell by providing each reference magnetic memory cell with write wires having different attributes;

measuring changes in switching characteristics of a reference magnetic memory cell, comprising sending sinusoidally varying test signals to each reference magnetic memory cell and measuring a phase difference between the test signals and changes in the orientations of the magnetizations of each reference magnetic memory cell; and modifying attributes of the write signals used to alter the orientations of the magnetizations in the magnetic memory cells based upon the measured changes in the switching characteristics of the reference magnetic memory cell.

5. The method of claim 4 wherein the step of measuring changes in switching characteristics of the reference magnetic memory cell further comprises sending test signals to an array of similar magnetic memory cells having predetermined attributes and determining which similar magnetic memory cell has the orientation of its magnetization altered by the test signals.

6. The method of claim 4 wherein the similar magnetic memory cells comprise rotational magnetic memory cells.

* * * * *